US008593316B2

(12) United States Patent
Rieger

(10) Patent No.: US 8,593,316 B2
(45) Date of Patent: Nov. 26, 2013

(54) COMBINED DIGITAL OUTPUT SYSTEM

(75) Inventor: Robert Rieger, Kaohsiung (TW)

(73) Assignee: Industrial Technology Research Institute, Hsinchu (TW)

( * ) Notice: Subject to any disclaimer, the term of this patent is extended or adjusted under 35 U.S.C. 154(b) by 375 days.

(21) Appl. No.: 13/157,671

(22) Filed: Jun. 10, 2011

(65) Prior Publication Data

US 2012/0212283 A1 Aug. 23, 2012

(30) Foreign Application Priority Data

Feb. 22, 2011 (TW) ............................ 100105715 A

(51) Int. Cl.
*H03M 1/00* (2006.01)
*G06G 7/16* (2006.01)

(52) U.S. Cl.
USPC ........... 341/119; 341/143; 341/144; 327/361; 327/308

(58) Field of Classification Search
USPC .......... 327/361, 308; 330/69, 9, 51, 258, 253, 330/261, 297, 311; 341/50, 143, 144, 155, 341/119
See application file for complete search history.

(56) References Cited

U.S. PATENT DOCUMENTS

| | | | | |
|---|---|---|---|---|
| 3,682,544 | A * | 8/1972 | Glaser | 399/79 |
| 4,105,942 | A | 8/1978 | Henry | |
| 5,838,200 | A | 11/1998 | Opris | |
| 6,469,916 | B1 * | 10/2002 | Kerkman et al. | 363/41 |
| 7,204,123 | B2 * | 4/2007 | McMahan et al. | 73/1.37 |
| 8,446,303 | B2 * | 5/2013 | Ali et al. | 341/118 |
| 2005/0093726 | A1 * | 5/2005 | Hezar et al. | 341/143 |
| 2005/0275576 | A1 * | 12/2005 | Fudge et al. | 341/155 |

* cited by examiner

*Primary Examiner* — Vibol Tan
(74) *Attorney, Agent, or Firm* — Birch, Stewart, Kolasch & Birch, LLP

(57) ABSTRACT

A combined digital output system includes two quantization modules, a common mode counter, a differential mode counter, and a summing module. The quantization modules provide two digital signals, the common mode counter generates a common mode signal according to the digital signals, the differential mode counter generates a differential mode signal according to the two digital signals, and the summing module obtains the common mode signal and the differential mode signal, so as to generate a summing signal.

13 Claims, 13 Drawing Sheets

COMBINED DIGITAL OUTPUT SYSTEM

CROSS-REFERENCE TO RELATED APPLICATION

This application claims the benefit of Taiwan Patent Application No. 100105715, filed on Feb. 22, 2011, which is hereby incorporated by reference for all purposes as if fully set forth herein.

BACKGROUND

1. Technical Field

The preset disclosure relates to a digital system with output from different modes, and more particularly to a combined digital output system combined with a common mode circuit and a differential mode circuit, and providing a common mode signal, a differential mode signal or an output signal with combination of the two.

2. Related Art

Referring to FIG. 1, a double differential mode recording system is an ordinary known technology for recording electromyogram signals or electroneurogram signals, and reducing common mode interferences. Two first-rank amplifiers 11 and a summing amplifier 12 are required in the system, in which, the first-level amplifier is connected to an electromyogram sensor 13, and a plurality of sensing units 14 is located in the electromyogram sensor 13 to sense different electromyogram signals. The first-rank amplifier 11 may obtain the electromyogram signals provided by the electromyogram sensor 13, and the electromyogram signals include the electromyogram signals and interference signals. When the electromyogram signals are recorded in a double differential mode recording manner, the system lays particular emphasis on the analysis of the electromyogram signals generated by muscles near the electromyogram sensor, and excludes high-gain signal data generated by the electromyogram signals in the common mode, and afterwards, digitalizes the measured analog electromyogram signals through an analog/digital (A/D) converter 15, so as to provide reference for the observers.

SUMMARY

Accordingly, the present disclosure is directed to a combined digital output system, which includes: a first modulation module, a second modulation module, a common mode counter (CM counter), a differential mode counter (DM counter), and a summing module.

The first modulation module is used to provide a first digital signal. The second modulation module is used to provide a second digital signal. The common mode counter is used to obtain the first digital signal and the second digital signal, and generate a common mode signal according to the first digital signal and the second digital signal. The differential mode counter is used to obtain the first digital signal and the second digital signal, so as to generate a differential mode signal according to the first digital signal and the second digital signal. The summing module is used to receive at least one of the common mode signal and the differential mode signal, so as to generate a summing signal.

BRIEF DESCRIPTION OF THE DRAWINGS

The present disclosure will become more fully understood from the detailed description given herein below for illustration only, and thus are not limitative of the present disclosure, and wherein.

DETAILED DESCRIPTION

The exemplary embodiments of the present disclosure are described in detail with reference to the accompanying drawings.

Figure 1:
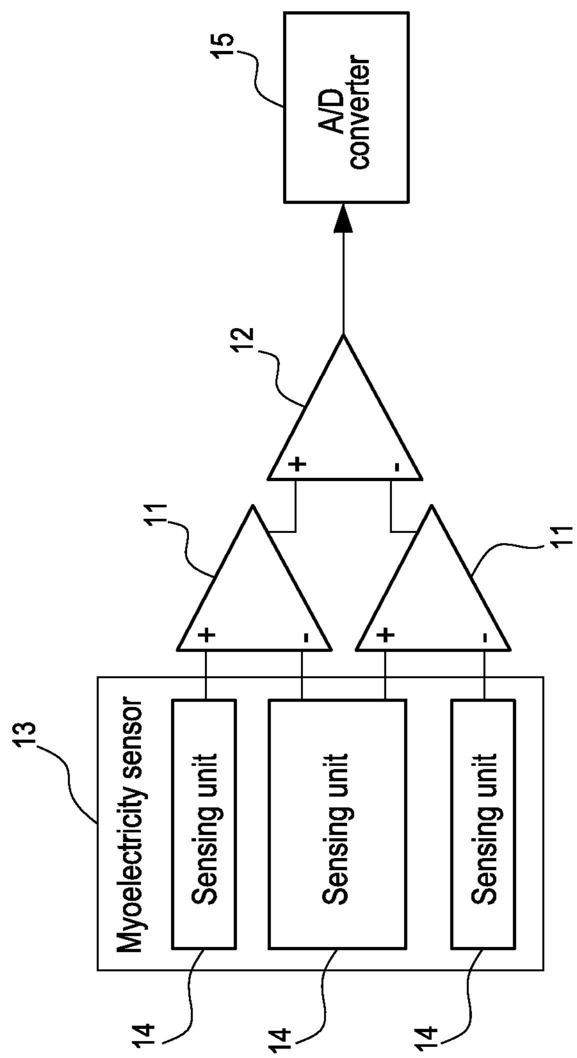
FIG. 1 is a schematic view of architecture of a double differential mode recording system in the prior art.
Figure 2:
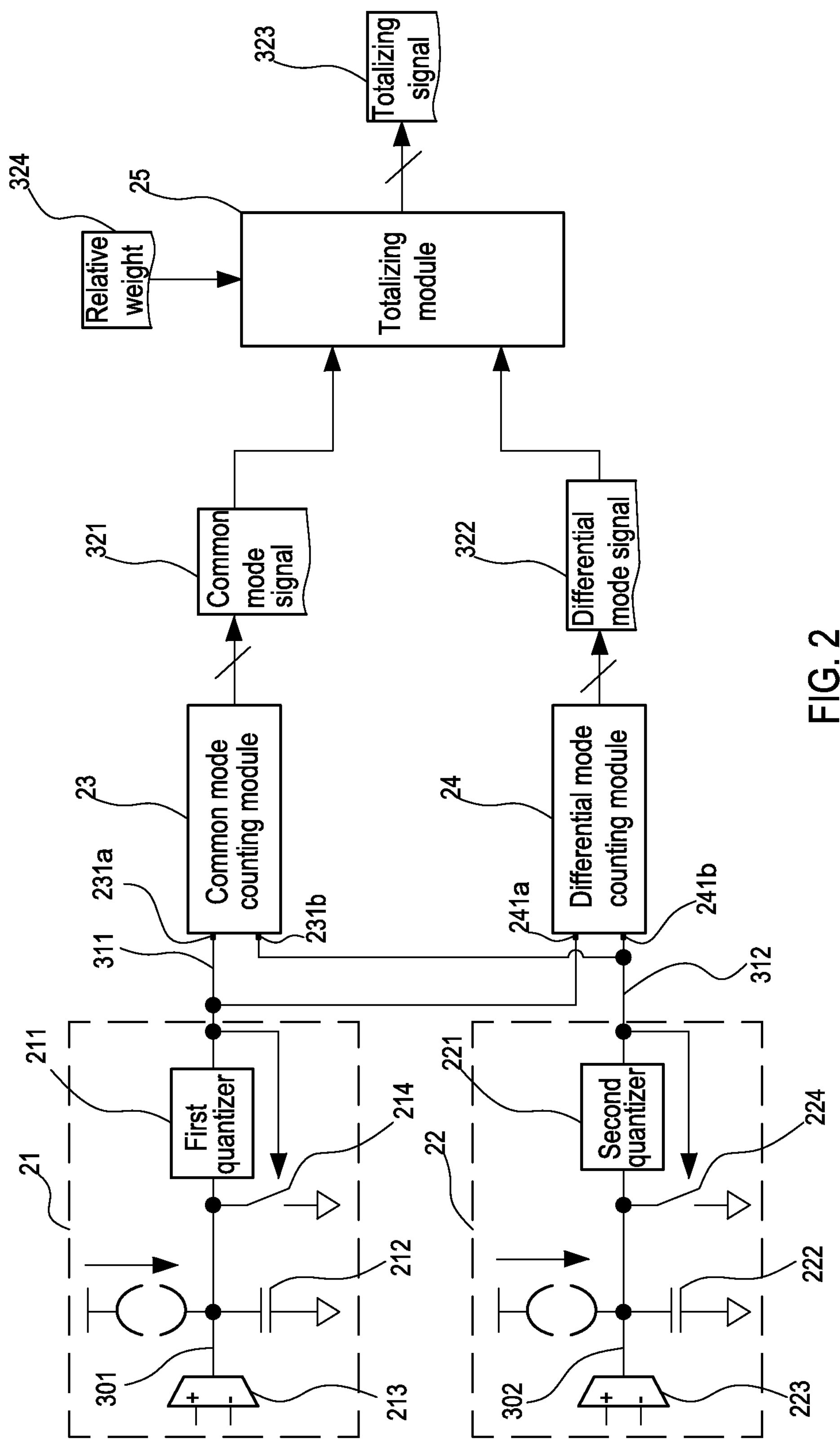
FIG. 2 is a schematic view of architecture of a combined digital output system according to an embodiment of the present disclosure.

FIG. 2 is a schematic view of architecture of a combined digital output system according to an embodiment of the present disclosure. Referring to FIG. 2, the system includes a first modulation module 21, a second modulation module 22, a common mode counter 23, a differential mode counter 24, and a summing module 25.

The first modulation module 21 includes a first amplifier 213 and a first integrating delta modulator, in which the first amplifier 213 is used to provide a first initial signal 301, and the first initial signal 301 is obtained and converted into a first digital signal 311 by the first increment amplitude modulation (AM) module. The first increment AM module includes a first integrating capacitor 212 and a first quantizer 211. A type of the first amplifier 213 is not limited, and is determined according to a type of the coordinated first quantizer 211.

Likewise, the second modulation module 22 includes a second amplifier 223 and a second integrating delta modulator, in which, the second amplifier 223 is used to provide a second initial signal 302, and the second initial signal 302 is obtained and converted to a second digital signal 312 by the second increment amplitude modulation (AM) module. The second increment AM module includes a second integrating capacitor 222 and a second quantizer 221. A type of the second amplifier 223 is also not limited, and is determined according to a type of the coordinated second quantizer 221. In addition, switches 214 and 224 may be respectively disposed on the first quantizer 211 and the second quantizer 221, and thus a user may control the switches 214 and 224 according to the requirements, so as to adjust content of the initial signals obtained by the first quantizer 211 and the second quantizer 221, thereby changing operating modes of the two quantizers, and further changing subsequent outputs.

The common mode counter 23 has two signal input pins 231*a* and 231*b*, which are respectively connected to output ends of the first quantizer 211 and the second quantizer 221, so as to obtain the first digital signal 311 and the second digital signal 312. The common mode counter 23 performs signal modulation according to the first digital signal 311 and the second digital signal 312, so as to generate a common mode signal 321.

The differential mode counter 24 has two signal input pins 241*a* and 241*b*, which are respectively connected to the output ends of the first quantizer 211 and the second quantizer 221, so as to obtain the first digital signal 311 and the second digital signal 312. The differential mode counter 24 performs the signal modulation according to the first digital signal 311 and the second digital signal 312, so as to generate a differential mode signal 322.

The summing module 25 adjusts a signal proportion between the common mode signal 321 and the differential mode signal 322 according to a relative weight 324 after obtaining the common mode signal 321 and the differential mode signal 322, thereby generating a summing signal 323.

Herein, the user may obtain the common mode signal 321 from an output end of the common mode counter 23, obtains the differential mode signal 322 from an output end of the differential mode counter 24, and obtains an combination output of the common mode signal 321 and the differential mode signal 322, that is the summing signal 323, from an output end of the summing module 25 according to requirements.

Figure 3:
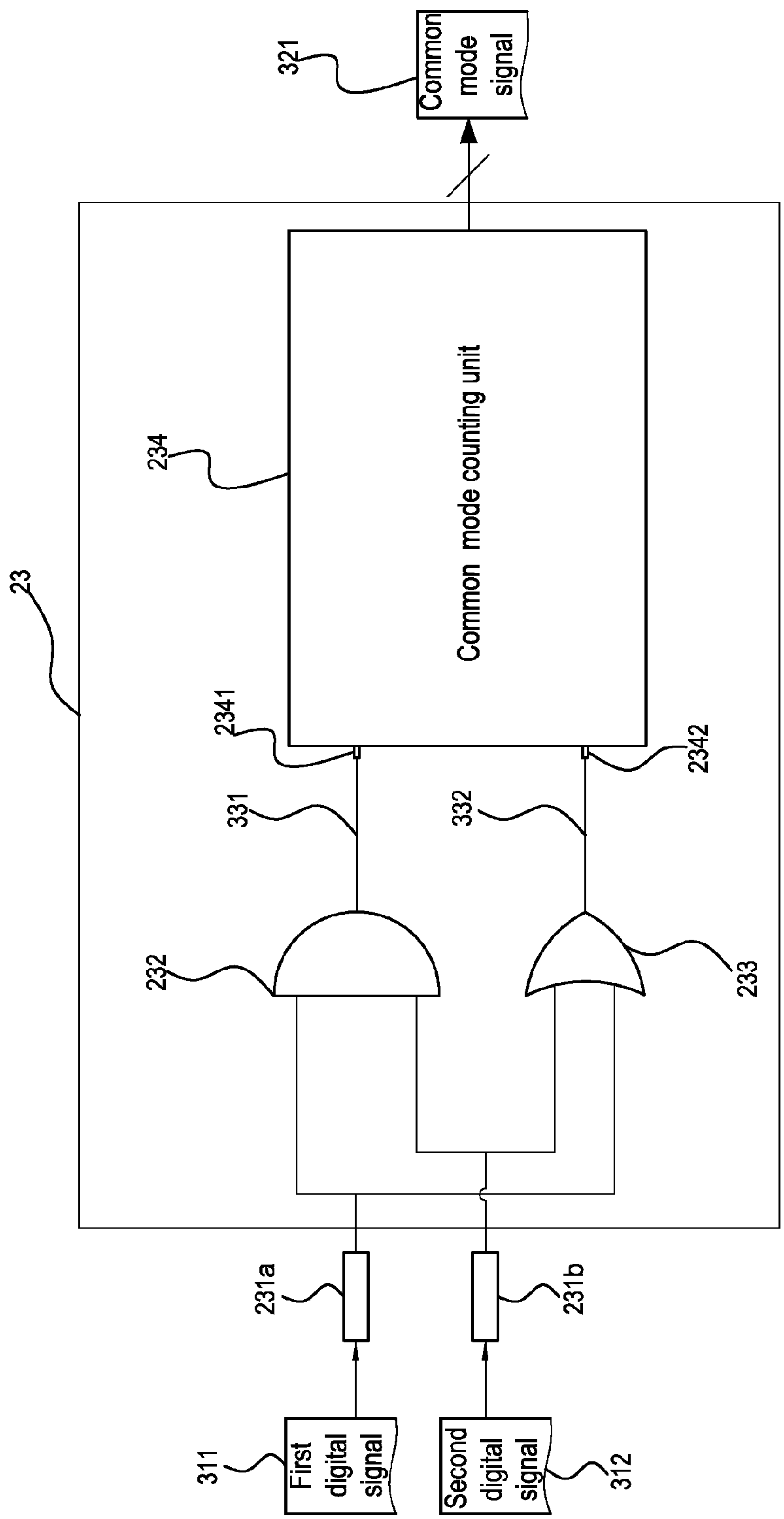
FIG. 3 is a schematic view of equivalent input control architecture of a common mode counter according to an embodiment of the present disclosure.
Figure 4:
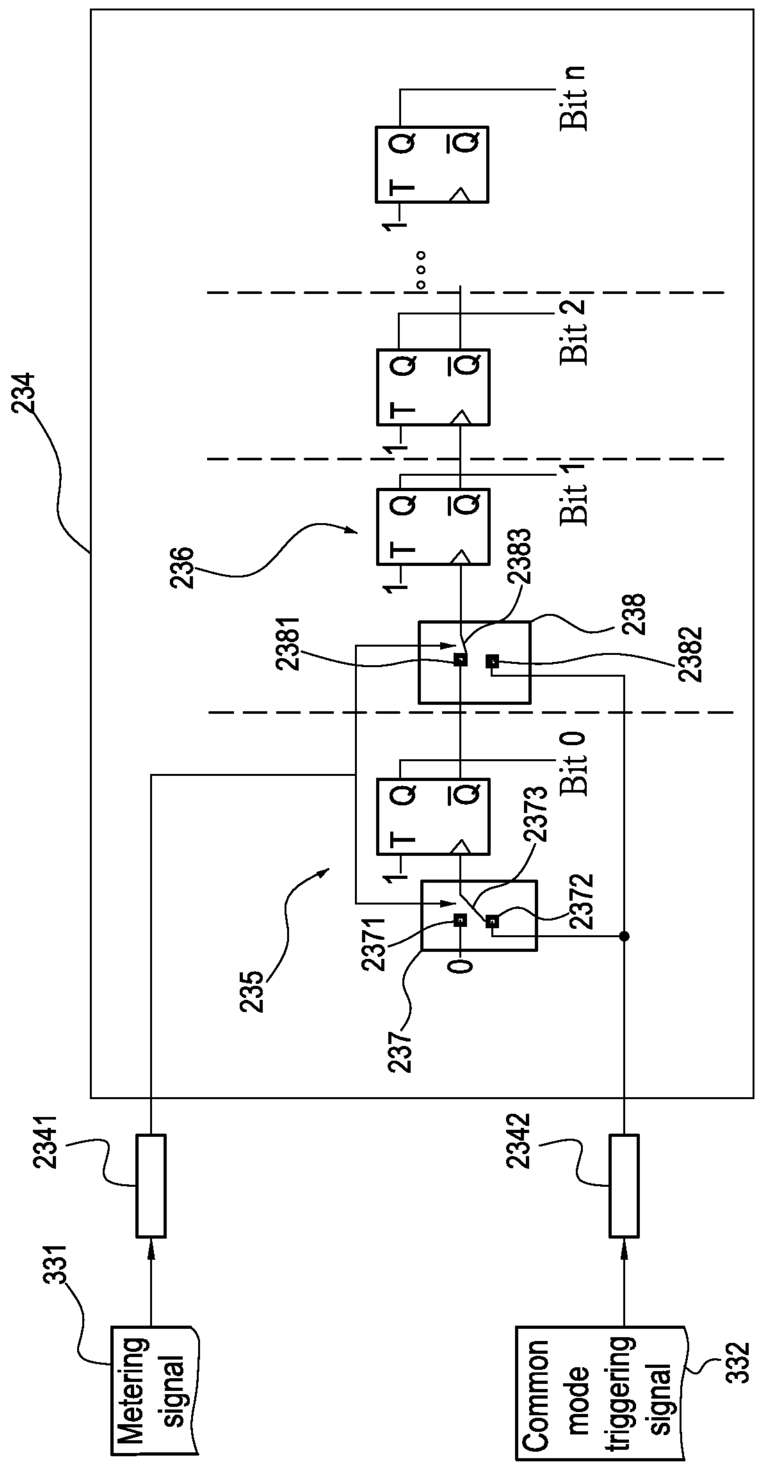
FIG. 4 is a schematic view of equivalent circuit architecture of a common mode counting unit according to an embodiment of the present disclosure.

FIG. 3 is a schematic view of equivalent input control architecture of a common mode counter according to an embodiment of the present disclosure, and FIG. 4 is a schematic view of equivalent circuit architecture of a common mode counting unit according to an embodiment of the present disclosure. Referring to FIG. 3 and FIG. 4, the common mode counter 23 includes an AND gate 232, an OR gate 233, and a common mode counting unit 234. The common mode counting unit 234 includes two pins, in which one of the pins is a clock pin 2342, and the other one is a signal pin 2341. The clock pin 2342 is connected to an output end of the OR gate 233, and the signal pin 2341 is connected to an output end of the AND gate 232. Two input ends of the AND gate 232 are respectively connected to two signal input pins 231*a* and 231*b* of the common mode counter 23, and likewise, two input ends of the OR gate 233 are also respectively connected to the two signal input pins 231*a* and 231*b* of the common mode counter 23. The AND gate 232 and the OR gate 233 may obtain the first digital signal 311 and the second digital signal 312 at the same time, the AND gate 232 may generate a count signal 331 and transmits the count signal 331 to the signal pin 2341 of the common mode counting unit 234, and the OR gate 233 generates a common mode triggering signal 332 and transmits the common mode triggering signal 332 to the clock pin 2342 of the common mode counting unit 234.

The common mode counting unit 234 is a ring counter, which includes a plurality of up-count stage circuit, in which a T-type flip-flop is taken as an example herein, but the present disclosure is not limited thereto.

A first switch unit 237 is coupled to a triggering contact of a first up-count stage circuit 235, a second switch unit 238 is coupled to a triggering contact of an $n^{th}$ up-count stage circuit, in which a second up-count stage circuit 236 is taken as an example herein. The switch operation of the two switch units is controlled by the count signal 331, and the common mode counting unit 234 improves a signal output of the common mode counting unit 234 according to switch states of the two switch units and content of the count signal 331. Two methods for improving the signal output are as follows, one is high increment behavior, and the other one is low increment behavior. The first switch unit 237 includes an idle contact 2371, a first clock contact 2372 connected to the clock pin 2342, and a first switch component 2373 connected to the triggering contact of the first up-count stage circuit 235 and the signal pin 2341. The first switch component 2373 is switched to be connected between the idle contact 2371 and the first clock contact 2372 under control of the count signal 331. The second switch unit 238 includes a connection contact 2381 connected to a reverse output of the first up-count stage circuit, a second clock contact 2382 connected to the clock pin 2342, and a second switch component 2383 connected to the triggering contact of the second up-count stage circuit and the signal pin 2341. The second switch component 2383 is switched to be connected between the connection contact 2381 and the second clock contact 2382 under the control of the count signal 331.

According to an operating principle of the AND gate 232, when any one of two input signals is in a signal low level, an output signal is in the signal low level. Therefore, when any one of the first digital signal 311 and the second digital signal 312 is in the signal low level, the count signal 331 is in the signal low level state. At this time, the first switch component 2373 is switched to be connected to the first clock contact 2372, the second switch component 2383 is switched to be connected to the connection contact 2381, the first up-count stage circuit 235 is triggered, the common mode counting unit 234 outputs from a $0^{th}$ bit, and the signal output is increased by a digital value being 1. The foregoing description is the low increment behavior.

However, according to the operating principle of the AND gate 232, when the two input signals are in a signal high level at the same time, the output signal is in the signal high level. Therefore, when the first digital signal 311 and the second digital signal 312 are in the signal high level at the same time, the count signal 331 is in the signal high level state. At the same time, the first switch component 2373 is switched to be connected to the idle contact 237, the second switch unit 238 is switched to be connected to the second clock contact 2382, the second up-count stage circuit 236 is triggered, the common mode counting unit 234 outputs from a first bit (bit 1) (or the bit higher than bit 1), and the signal output is increased by a digital value being 2 (or a digital value greater than 2). The foregoing description is the high increment behavior. Since signal transmission of the OR gate 233 is slightly later than the AND gate 232, when the common mode triggering signal 332 is in the signal high level, the count signal 331 must be in the signal high level.

Figure 5:
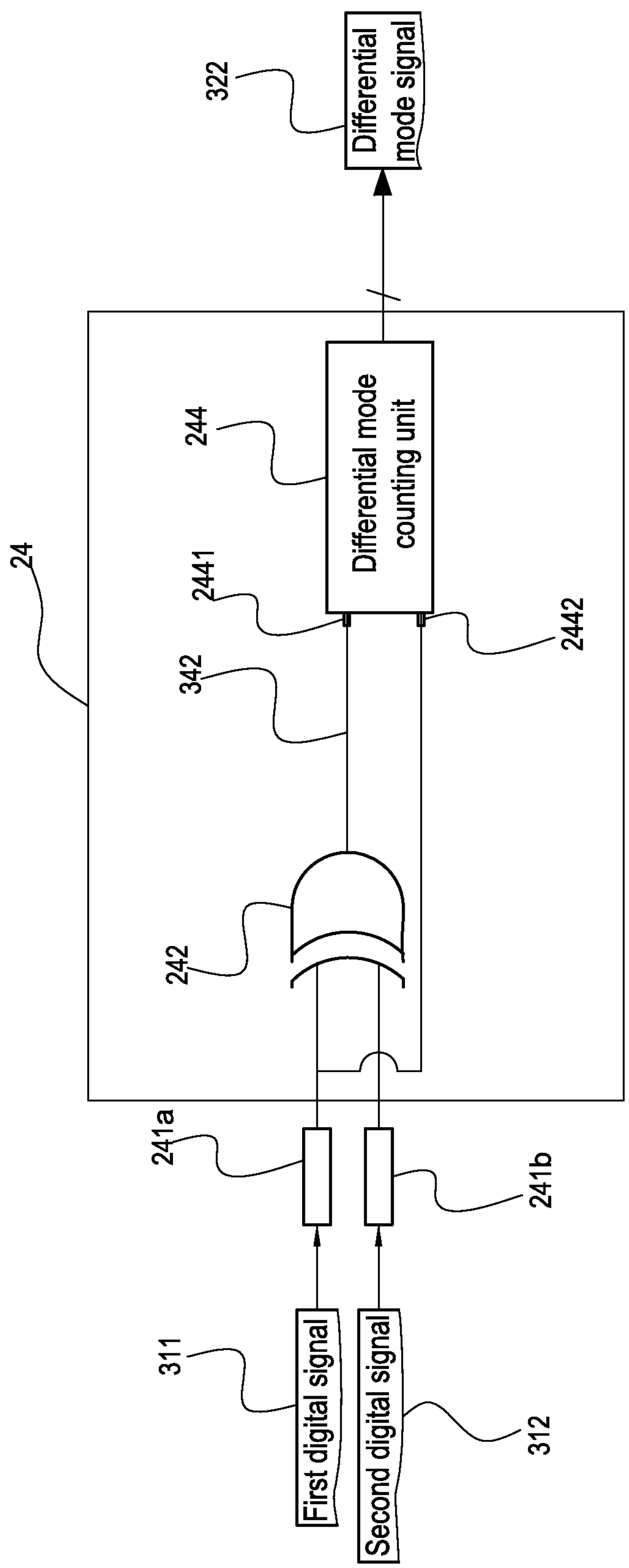
FIG. 5 is a schematic view of equivalent input control architecture of a differential mode counter according to an embodiment of the present disclosure.
Figure 6:
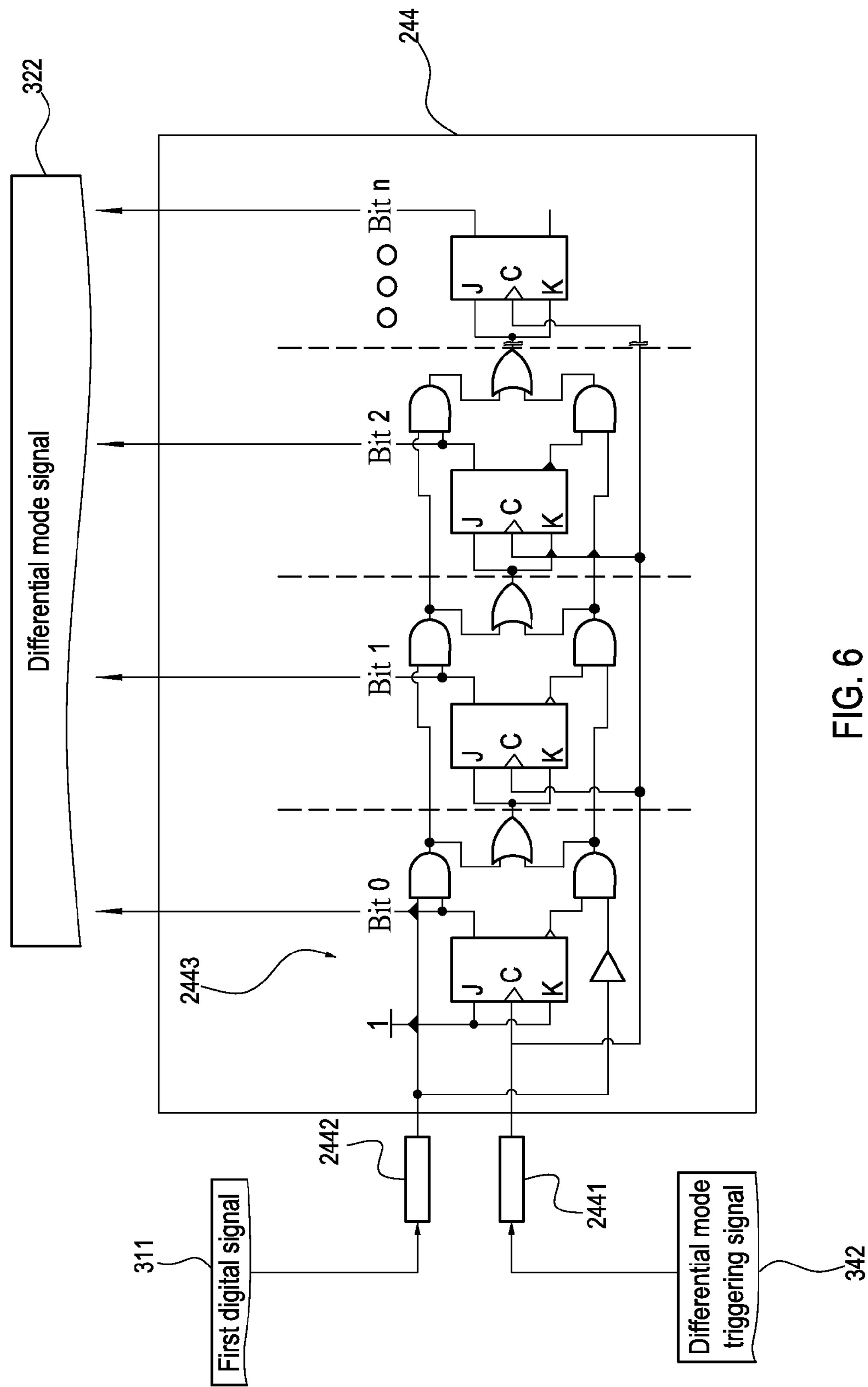
FIG. 6 is a schematic view of equivalent circuit architecture of a differential mode counting unit according to an embodiment of the present disclosure.
Figure 7A:
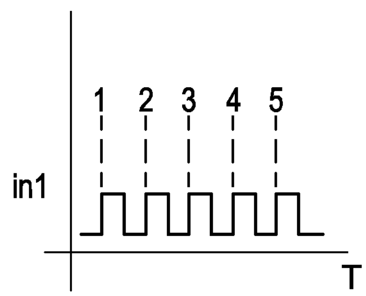
FIG. 7A to FIG. 7D are schematic views of a first type of signal input and output according to an embodiment of the present disclosure.
Figure 7B:
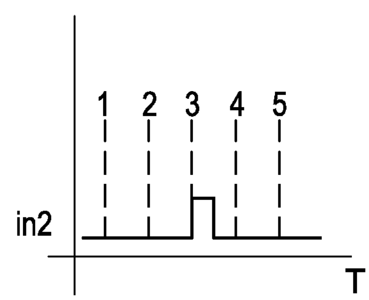
Figure 7C:
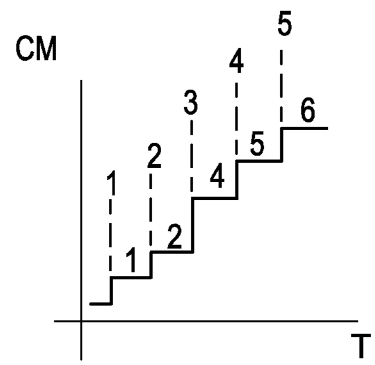
Figure 7D:
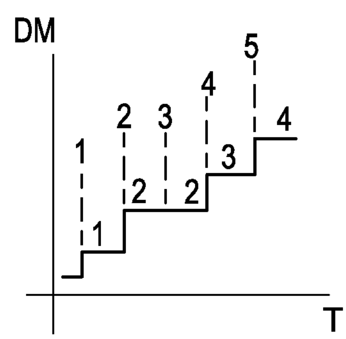
Figure 8A:
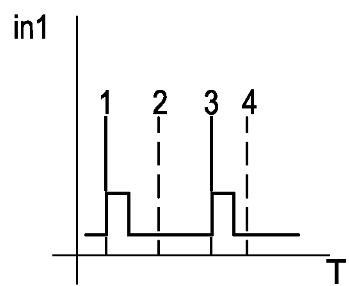
FIG. 8A to FIG. 8D are schematic views of a second type of signal input and output according to an embodiment of the present disclosure.
Figure 8B:
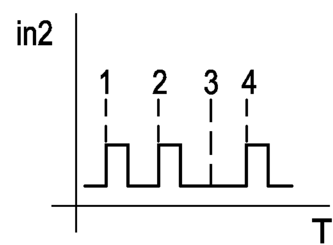
Figure 8C:
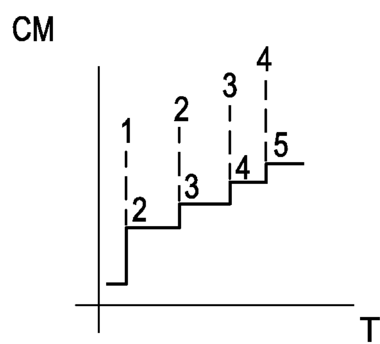
Figure 8D:
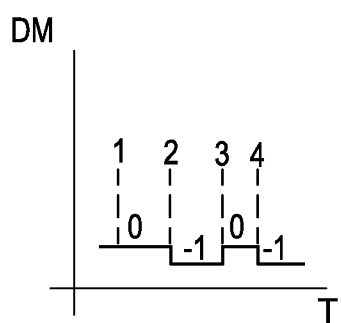
Figure 9A:
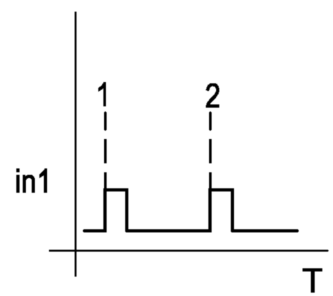
FIG. 9A to FIG. 9D are schematic views of a third type of signal input and output according to an embodiment of the present disclosure.
Figure 9B:
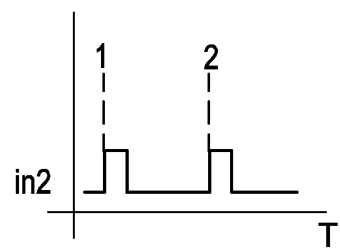
Figure 9C:
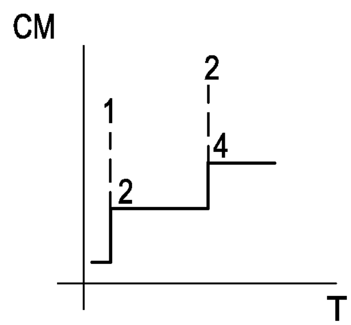
Figure 9D:
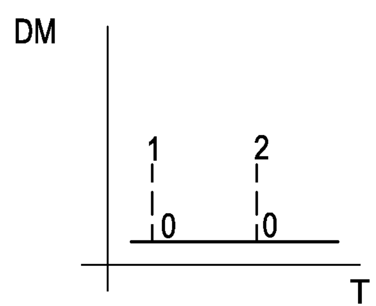

FIG. 5 is a schematic view of equivalent input control architecture of a differential mode counter according to an embodiment of the present disclosure, and FIG. 6 is a schematic view of equivalent circuit architecture of a differential mode counter according to an embodiment of the present disclosure.

The differential mode counter 24 includes a differential mode counting unit 244 and an exclusive OR gate 242. The difference counting unit 244 includes a clock pin 2441 and a signal pin 2442. The clock pin 2441 is connected to an output end of the exclusive OR gate 242. Two input ends of the exclusive OR gate 242 are respectively connected to two signal input pins (241*a* and 241*b*) of the differential mode counter 24, The exclusive OR gate 242 may obtain the first digital signal 311 and the second digital signal 312 at the same time, so as to generate and transmit a differential mode triggering signal 342 to the clock pin 2441 of the differential mode counting unit 244. The differential mode counting unit 244 is connected to the signal input pin 241 a through the signal pin 2442, so as to obtain the first digital signal 311.

The differential mode counting unit 244 may be an up/down-counter, which includes a plurality of up/down-count stage circuit 2443 serially connected. The clock pin 2441 of the differential mode counting unit 244 is connected to a triggering contact of each JK-type flip-flop. The differential mode counting unit 244 determines whether to adjust a signal output of the differential mode counting unit 244 according to content of the differential mode triggering signal 342, and the specific description thereof is as follows.

According to an operating principle of the exclusive OR gate 242, when two input signals are in the signal high level or in the signal low level at the same time, the output signal is in the signal low level, that is, when the first digital signal 311 and the second digital signal 312 are in the signal high level at the same time, the differential mode triggering signal 342 output by the exclusive OR gate 242 is in the signal low level, each up/down-count stage circuit 2443 maintains the original output, and the positive or negative counting compensation and the signal output of the differential mode counting unit 244 remain unchanged.

According to the operating principle of the exclusive OR gate 242, when the two input signals are different, the output signal is in the signal high level, that is, when one of the first digital signal 311 and the second digital signal 312 is in the signal high level, and the other one is in the signal low level, the differential mode counting unit 244 may determine whether to improve or reduce the signal output of the differential mode counting unit 244 according to content of the first digital signal 311, and the specific description thereof is as follows.

When the first digital signal 311 is in the signal low level, and the second digital signal 312 is in the signal high level, the differential mode counting unit 244 reduces the signal output thereof On the contrary, when the first digital signal 311 is in the signal high level, and the second digital signal 312 is in the signal low level, the differential mode counting unit 244 improves the signal output thereof.

When the first digital signal 311 is in the signal high level, and the second digital signal 312 is in the signal low level, since the differential mode triggering signal 342 is generated by the exclusive OR gate 242, a time point of obtaining the first digital signal 311 by the differential mode counting unit 244 is slightly earlier than a time point of obtaining the differential mode triggering signal 342. However, the delay of the exclusive OR gate 242 or the delay of the OR gate 233 may be determined by a circuit designer according to different requirements.

FIG. 7A to FIG. 7D are schematic views of a first type of signal input and output according to an embodiment of the present disclosure. Referring to FIG. 7A to FIG. 7D in combination with FIG. 2 to FIG. 6 for ease of understanding, in the following description, a T period is used as a time unit, the first digital signal 311 is expressed as in1, and the second digital signal 312 is expressed as in2, and moreover, positive edge trigger is used for description.

It is supposed that the first digital signal 311 is greater than the second digital signal 312, the pulse number of the first digital signal 311 is higher than the pulse number of the second digital signal 312 in the same T period. Herein, for example, the first modulation module 21 generates five pulses in the T period, and the second modulation module 22 generates one pulse in the T period, but the present disclosure is not limited thereto.

At a time point 1, the first modulation module 21 generates one pulse (the signal high level), but the second modulation module 22 does not generate any pulse (the signal low level). As described in the above, the count signal 331 of the common mode counter 23 may be in the signal low level, that is, no pulse is generated, while the common mode triggering signal 332 of the common mode counter 23 may be in the signal high level, so as to trigger the common mode counting unit 234. The first switch component 2373 is switched to the first clock contact 2372, the second switch component 2383 is switched to the connection contact 2381, the first up-count stage circuit 235 is triggered, the common mode counting unit 234 outputs from a $0^{th}$ bit, and the signal output is increased by an digital value being 1, such that the digital value changes from 0 to 1.

As described in the above, the differential mode triggering signal 342 of the differential mode counter 24 may be in the signal high level, so as to trigger the differential mode counting unit 244. At this time, when the first digital signal 311 is in the signal high level, and the second digital signal 312 is in the signal low level, the differential mode counting unit 244 improves the signal output thereof, that is, the digital value changes from 0 to 1.

At a time point 2, the first modulation module 21 generates one pulse, the second modulation module 22 does not generate any pulse, and operation modes of the common mode counter 23 and the differential mode counter 24 are the same as that in the time point 1, that is, the signal output of the common mode counter 23 changes from the digital value being 1 to the digital value being 2, and the signal output of the differential mode counter 24 changes from the digital value being 1 to the digital value being 2.

At the time point 3, the first modulation module 21 and the second modulation module 22 respectively generate one pulse (the signal high level). The count signal 331 of the common mode counter 23 may be in the signal high level. The first switch component 2373 is switched to the idle contact 2371, the second switch component 2383 is switched to the second clock contact 2382, the first up-count stage circuit 235 is triggered, the common mode counting unit 234 outputs from a first bit (bit 1), and the signal output is increased by the digital value being 2, such that the digital value changes from 2 to 4.

The differential mode triggering signal 342 of the differential mode counter 24 may be in the signal low level. At this time, each up/down-count stage circuit 2443 maintains the original output, the positive or negative counting compensation and the signal output of the differential mode counting unit 244 remain unchanged, and the signal output of the differential mode counter 24 still maintains the digital value being 2.

Likewise, at the time point 4 and the time point 5, the signal output of the common mode counter 23 is increased by 1 in series, and the signal output of the differential mode counter 24 is also increased by 1 in series. In the T period, when the signal output of the common mode counter 23 is 6, the output is the common mode signal 321; and when the signal output of the differential mode counter 24 is 4, the output is the differential mode signal 322.

Referring to FIG. 8A to FIG. 8D and also FIG. 2 to FIG. 6 for ease of understanding, FIG. 8A to FIG. 8D are schematic views of a second type of input and output according to an embodiment of the present disclosure.

It is supposed that the first digital signal 311 is smaller than the second digital signal 312, and the pulse number of the first digital signal 311 is lower than the pulse number of the second digital signal 312 in the same T period. Herein, for example, the first modulation module 21 generates three pulses in the T period, and the second modulation module 22 generates two pulses in the T period, but the present disclosure is not limited thereto.

At the time point 1, the first modulation module 21 and the second modulation module 22 respectively generate one pulse (the signal high level). The count signal 331 of the common mode counter 23 is in the signal high level, the first switch component 2373 is switched to the idle contact 2371, the second switch component 2383 is switched to the second clock contact 2382, the first up-count stage circuit 235 is triggered, the common mode counting unit 234 outputs from the first bit, and the signal output is increased by the digital value being 2, such that the digital value changes from 0 to 2.

The differential mode triggering signal 342 of the differential mode counter 24 may be in the signal low level. At this time, each up/down-count stage circuit 2443 maintains the original output, the positive or negative counting compensation and the signal output of the differential mode counting unit 244 remain unchanged, and the signal output of the differential mode counter 24 still maintains the digital value being 0.

At the time point 2, the first modulation module 21 does not generate any pulse (the signal low level), but the second modulation module 22 generates one pulse (the signal high level). If the count signal 331 of the common mode counter 23 may be in the signal low level, the common mode triggering signal 332 of the common mode counter 23 may be in the signal high level, so as to trigger the common mode counting unit 234. The first switch component 2373 is switched to the first clock contact 2372, the second switch component 2383 is switched to the connection contact 2381, the first up-count stage circuit 235 is triggered, the common mode counting unit 234 outputs from the $0^{th}$ bit, and the signal output is increased by the digital value being 1, such that the digital value changes from 2 to 3.

The differential mode triggering signal 342 of the differential mode counter 24 may be in the signal high level, so as to trigger the differential mode counting unit 244. At this time, when the first digital signal 311 is in the signal low level, and the second digital signal 312 is in the signal high level, the differential mode counting unit 244 reduces the signal output thereof, that is, the digital value changes from 0 to −1.

At the time point 3, the first modulation module 21 generates one pulse (the signal high level), but the second modulation module 22 does not generate any pulse (the signal low level). The count signal 331 of the common mode counter 23 may be in the signal low level. The first switch component 2373 may be switched to the first clock contact 2372, the second switch component 2383 is switched to the connection contact 2381, the first up-count stage circuit 235 is triggered, the common mode counting unit 234 outputs from the $0^{th}$ bit, and the signal output is increased by the digital value being 1, such that the digital value changes from 3 to 4.

The differential mode triggering signal 342 of the differential mode counter 24 may be in the signal high level, so as to trigger the differential mode counting unit 244. At this time, the first digital signal 311 is in the signal high level, the second digital signal 312 is in the signal low level, and the differential mode counting unit 244 improves the signal output thereof, that is, the digital value changes from −1 to 0.

At the time point 4, the first modulation module 21 does not generate any pulse (the signal low level), but the second modulation module 22 generates one pulse (the signal high level). If the count signal 331 of the common mode counter 23 may be in the signal low level, the common mode triggering signal 332 of the common mode counter 23 may be in the signal high level, so as to trigger the common mode counting unit 234. The first switch component 2373 is switched to the first clock contact 2372, the second switch component 2383 is switched to the connection contact 2381, the first up-count stage circuit 235 is triggered, the common mode counting unit 234 outputs from the $0^{th}$ bit, and the signal output is increased by the digital value being 1, such that the digital value changes from 2 to 3.

The differential mode triggering signal 342 of the differential mode counter 24 may be in the signal high level, so as to trigger the differential mode counting unit 244. At this time, when the first digital signal 311 is in the signal low level, and the second digital signal 312 is in the signal high level, the differential mode counting unit 244 reduces the signal output thereof, that is, the digital value changes from 0 to −1.

In the T period, when the signal output of the common mode counter 23 is 5, the output is the common mode signal 321; and when the signal output of the differential mode counter 24 is −1, the output is the differential mode signal 322.

Referring to FIG. 9A to FIG. 9D in combination with FIG. 2 to FIG. 6 for ease of understanding, FIG. 9A to FIG. 9D are schematic views of a third type of signal input and output according to an embodiment of the present disclosure.

It is supposed that the first digital signal 311 is equal to the second digital signal 312, in the same period T, the pulse number of the first digital signal 311 is equal to the pulse number of the second digital signal 312. Herein, for example, the first modulation module 21 and the second modulation module 22 generate two pulses in the T period, but the present disclosure is not limited thereto.

At the time point 1, the first modulation module 21 and the second modulation module 22 respectively generate one pulse (the signal high level). The count signal 331 of the common mode counter 23 is in the signal high level, the first switch component 2373 is switched to the idle contact 2371, the second switch component 2383 is switched to the second clock contact 2382, the first up-count stage circuit 235 is triggered, the common mode counting unit 234 outputs from the first bit (bit 1), and the signal output is increased by the digital value being 2, such that the digital value changes from 0 to 2.

The differential mode triggering signal 342 of the differential mode counter 24 may be in the signal low level. At this time, each up/down-count stage circuit 2443 maintains the original output, the positive or negative counting compensation and the signal output of the differential mode counting unit 244 remain unchanged, and the signal output of the differential mode counter 24 still maintains the digital value being 0.

At the time point 2, the first modulation module 21 and the second modulation module 22 respectively generate one pulse (the signal high level). Operating modes of the common mode counter 23 and the differential mode counter 24 are the same as the mode at the time point 1, the signal output of the common mode counter 23 changes from the digital value being 2 to 4, and the signal output of the differential mode counter 24 still remains the digital value being 0.

In the T period, when the signal output of the common mode counter 23 is 4, the output is the common mode signal 321; and when the signal output of the differential mode counter 24 is 0, the output is the differential mode signal 322.

In the foregoing embodiments, after the T period, each counting module is reset for starting a new calculation period, and the resetting action of the counting module is not limited, and is determined according to the requirements of the designer.

Figure 10C:
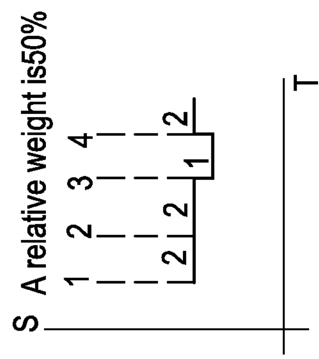
FIG. 10A to FIG. 10C are schematic views of a mode signal input and a summing signal output according to an embodiment of the present disclosure.
Figure 10B:
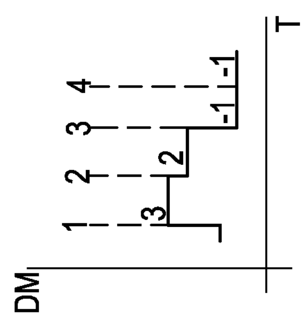
Figure 10A:
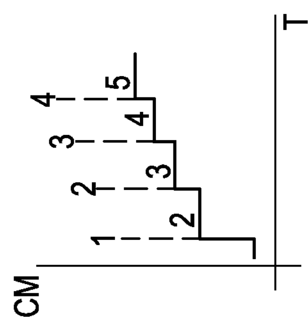

FIG. 10A to FIG. 10C are schematic views of a mode signal input and a summing signal 323 output according to an embodiment of the present disclosure. As described in the above, the summing module 25 may adjust a signal proportion between the common mode signal 321 and the differential mode signal 322 according to a relative weight 324. A value of the relative weight 324 is set by the designer, and is supposed to be 50% herein, but the present disclosure is not limited thereto. From the time point 1 to the time point 4, the digital values of the common mode signal 321 are respectively 2, 3, 4 and 5, and the digital values of the differential mode signal 321 are respectively 3, 2, −1 and −1. At the time point 1, the digital value of the summing signal 323 (represented by S) is 2×50%+3×50%=2.5, and since the summing signal 323 is output as an integer, the digital value of the summing signal 323 is 2.

Likewise, at the time point 2, the digital value of the summing signal 323 is 3×50%+2×50%=2.5, and since the summing signal 323 is output as an integer, the digital value of the summing signal 323 is 2. At the time point 3, the digital value of the summing signal 323 is 4×50%+(−1)×50%=1, and since the summing signal 323 is output as an integer, the digital value of the summing signal 323 is 1. At the time point 4, the digital value of the summing signal 323 is 5×50%+(−1)×50%=2, and since the summing signal 323 is output as an integer, the digital value of the summing signal 323 is 2.

The disclosure being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A combined digital output system, comprising:

a first modulation module, used to provide a first digital signal;

a second modulation module, used to provide a second digital signal;

a common mode counter, used to obtain the first digital signal and the second digital signal, and generate a common mode signal according to the first digital signal and the second digital signal;

a differential mode counter, used to obtain the first digital signal and the second digital signal, and generate a differential mode signal according to the first digital signal and the second digital signal; and a summing module, used to receive at least one of the common mode signal and the differential mode signal, so as to generate a summing signal.

2. The combined digital output system according to claim 1, wherein the common mode counter comprises two signal input pins and a common mode counting unit, the common mode counting unit comprises a clock pin and a signal pin, the clock pin is connected to an output end of an OR gate, the signal pin is connected to an output end of an AND gate, two input ends of the AND gate are respectively connected to the two signal input pins, two input ends of the OR gate are respectively connected to the two signal input pins, the AND gate and the OR gate obtain the first digital signal and the second digital signal at the same time, the AND gate generates and transmits a count signal to the signal pin, and the OR gate generates and transmits a common mode triggering signal to the clock pin.

3. The combined digital output system according to claim 2, wherein the common mode counting unit is a ring counter, and comprises a plurality of up-count stage circuit, a first switch unit, and a second switch unit, the first switch unit comprises an idle contact, a first clock contact connected to the clock pin, and a first switch component connected to a triggering contact of a first up-count stage circuit and the signal pin, the first switch component is switched to be connected between the idle contact and the first clock contact under control of the count signal, the second switch unit comprises a connection contact connected to an reverse output of an $(n-1)^{th}$ up-count stage circuit, a second clock contact connected to the clock pin, and a second switch component connected to a triggering contact of an $n^{th}$ up-count stage circuit and the signal pin, and the second switch component is switched to be connected between the connection contact and the second clock contact under the control of the count signal.

4. The combined digital output system according to claim 3, wherein when the first digital signal and the second digital signal are in a signal high level, the first switch unit operates to stop the first up-count stage circuit, the second switch unit triggers the $n^{th}$ up-count stage circuit, and the common mode counting unit performs high increment behavior on an signal output.

5. The combined digital output system according to claim 3, wherein when any one of the first digital signal and the second digital signal is in a signal low level, the second switch unit operates to stop the $n^{th}$ up-count stage circuit, the first switch unit triggers the first up-count stage circuit, and the common mode counting unit performs low increment behavior on an signal output.

6. The combined digital output system according to claim 1, wherein the differential mode counter comprises a differential mode counting unit, the differential mode counting unit comprises a clock pin and a signal pin, the clock pin is connected to an output end of an exclusive OR gate, the signal pin is used to receive the first digital signal, and the exclusive OR gate is used to obtain the first digital signal and the second digital signal, so as to generate and transmit a differential mode triggering signal to the clock pin.

7. The combined digital output system according to claim 6, wherein the differential mode counting unit is an up/down-counter, and comprises a plurality of up/down-count stage circuits, and the differential mode counting unit determines whether to adjust a signal output of the differential mode counting unit according to content of the differential mode triggering signal.

8. The combined digital output system according to claim 7, wherein when the first digital signal and the second digital signal are in a signal high level at the same time, the differential mode counting unit maintains the signal output, and when the first digital signal and the second digital signal are different, whether to improve or reduce the signal output of the differential mode counting unit is determined according to content of the first digital signal.

9. The combined digital output system according to claim 8, wherein when the first digital signal is in a signal low level, and the second digital signal is in the signal high level, the differential mode counting unit reduces the signal output.

10. The combined digital output system according to claim 8, wherein when the first digital signal is in the signal high level, and the second digital signal is in a signal low level, the differential mode counting unit improves the signal output.

11. The combined digital output system according to claim 1, wherein the first modulation module comprises a first amplifier and a first increment amplitude modulator, the first amplifier is used to provide a first initial signal, the first increment amplitude modulator is used to convert the first initial signal to the first digital signal, the second modulation module comprises a second amplifier and a second increment amplitude modulator, the second amplifier is used to provide a second initial signal, and the second increment amplitude modulator is used to convert the second initial signal to the second digital signal.

12. The combined digital output system according to claim 1, wherein the first increment amplitude modulator and the second increment amplitude modulator respectively comprise a quantizer and an integrating capacitor.

13. The combined digital output system according to claim 1, wherein the summing module is further used to obtain a relative weight, and adjust a proportion between the common mode signal and the differential mode signal according to the relative weight to generate the summing signal.

* * * * *